United States Patent
Thaik et al.

(10) Patent No.: US 9,998,100 B2
(45) Date of Patent: Jun. 12, 2018

(54) PACKAGE PROGRAMMABLE DECOUPLING CAPACITOR ARRAY

(71) Applicant: Ampere Computing LLC, Santa Clara, CA (US)

(72) Inventors: Rich Thaik, San Jose, CA (US); Alfred Yeung, Fremont, CA (US); April Lambert, Scotts Valley, CA (US); Jeremy Plunkett, San Jose, CA (US)

(73) Assignee: Ampere Computing LLC, Santa Clara, CA (US)

( * ) Notice: Subject to any disclaimer, the term of this patent is extended or adjusted under 35 U.S.C. 154(b) by 0 days. days.

(21) Appl. No.: 14/838,778

(22) Filed: Aug. 28, 2015

(65) Prior Publication Data

US 2017/0063355 A1  Mar. 2, 2017

(51) Int. Cl.
| | |
|---|---|
| *H03K 5/1252* | (2006.01) |
| *H01L 23/525* | (2006.01) |
| *H01L 23/50* | (2006.01) |
| *H01L 23/522* | (2006.01) |

(52) U.S. Cl.
CPC .......... *H03K 5/1252* (2013.01); *H01L 23/50* (2013.01); *H01L 23/525* (2013.01); *H01L 23/5223* (2013.01)

(58) Field of Classification Search
CPC ... H01L 23/00; H01L 23/5223; H01L 23/525; H03H 11/00; H03H 11/04; H03H 11/0422; H03H 11/1217; H03H 11/1252; H03H 11/126; H03K 5/00; H03K 5/1252
USPC ........................................................ 327/556
See application file for complete search history.

(56) References Cited

U.S. PATENT DOCUMENTS

| | | |
|---|---|---|
| 5,883,423 A | 3/1999 | Patwa et al. |
| 6,411,494 B1 | 6/2002 | Watt et al. |
| 7,227,211 B2 | 6/2007 | Tsutsumi et al. |
| 7,235,875 B2 | 6/2007 | Booth et al. |
| 7,247,543 B2 | 7/2007 | Shih et al. |
| 8,411,399 B2 | 4/2013 | Venkatraman et al. |
| 8,614,130 B2 | 12/2013 | Jensen et al. |
| 8,739,097 B2 | 5/2014 | Hu et al. |
| 2002/0119583 A1 | 8/2002 | Seshan |
| 2008/0296697 A1 | 12/2008 | Hsu et al. |
| 2011/0018126 A1* | 1/2011 | Kling .................... H01L 23/055 257/713 |

(Continued)

FOREIGN PATENT DOCUMENTS

| | | |
|---|---|---|
| JP | 06-091181 B2 | 11/1994 |
| KR | 10-0708605 B1 | 4/2007 |

OTHER PUBLICATIONS

International Search Report & Written Opinion for PCT Application Serial No. PCT/US2016/048857, dated Nov. 18, 2016, 9 pages.

*Primary Examiner* — Lincoln Donovan
*Assistant Examiner* — David Mattison
(74) *Attorney, Agent, or Firm* — Alston & Bird LLP

(57) ABSTRACT

A semiconductor chip allows for a selected amount of on-die decoupling capacitance to be connected to a very-large-scale integrated circuit (VLSI) system after the circuit design is complete. The semiconductor chip comprises an integrated circuit disposed on a packaging substrate, and a power distribution network that is electrically connectable to the integrated circuit via a programmable connectivity array via the packaging substrate.

20 Claims, 6 Drawing Sheets

(56) References Cited

U.S. PATENT DOCUMENTS

2011/0085311 A1\* 4/2011 Chen ................. H01L 23/64
  361/782
2011/0117716 A1 5/2011 Quinlan et al.
2014/0185264 A1\* 7/2014 Chen ................. H01L 23/3128
  361/814
2014/0374877 A1\* 12/2014 Oh .................... H01L 23/5223
  257/532

\* cited by examiner

PACKAGE PROGRAMMABLE DECOUPLING CAPACITOR ARRAY

TECHNICAL FIELD

The subject disclosure relates generally to electrical design, and in particular the use of package programmable decoupling capacitors in an integrated circuit to allow for a degree of flexibility regarding the amount decoupling capacitance used in the final design.

BACKGROUND

Decoupling capacitors (DCAPs) are an important component of power distribution networks (PDNs) for very-large-scale-integrated circuit (VLSI) designs. These decoupling capacitors shunt the supply noise caused by active circuit elements through the capacitor, thereby suppressing the supply noise observed by other elements of the circuit that are about to become active.

Several considerations are important to DCAP design, including high area efficiency, robust electrical properties, and properly targeted operational frequency. In a typical VLSI system, the integrated circuit (IC) chip is connected to a voltage regulator through its PDN, and supply noise is suppressed by decoupling capacitors placed throughout the system. These decoupling capacitors can include on-die DCAPs that are integrated on the chip itself and placed near the active circuit elements, package level DCAPS installed on the VLSI's package, and/or board level DCAPs installed on the circuit board on which the VLSI is installed.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a semiconductor chip is provided, an integrated circuit disposed on a packaging substrate, and a power distribution network that is electrically connectable to the integrated circuit via a programmable connectivity array via the packaging substrate.

Also, a method of suppressing power supply noise in a semiconductor chip is provided, comprising placing a programmable connectivity array physically near an integrated circuit embedded in a semiconductor chip, wherein the semiconductor chip is supported by a packaging substrate, and supplying power to the integrated circuit via a programmable connectivity array through the packaging substrate.

In addition, a method of suppressing resonant peaks in an integrated circuit in a semiconductor chip is provided, comprising supporting the semiconductor chip on a packaging substrate, and supplying power to the integrated circuit via a programmable connectivity array through the packaging substrate, wherein the programmable connectivity array is placed physically near the integrated circuit.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
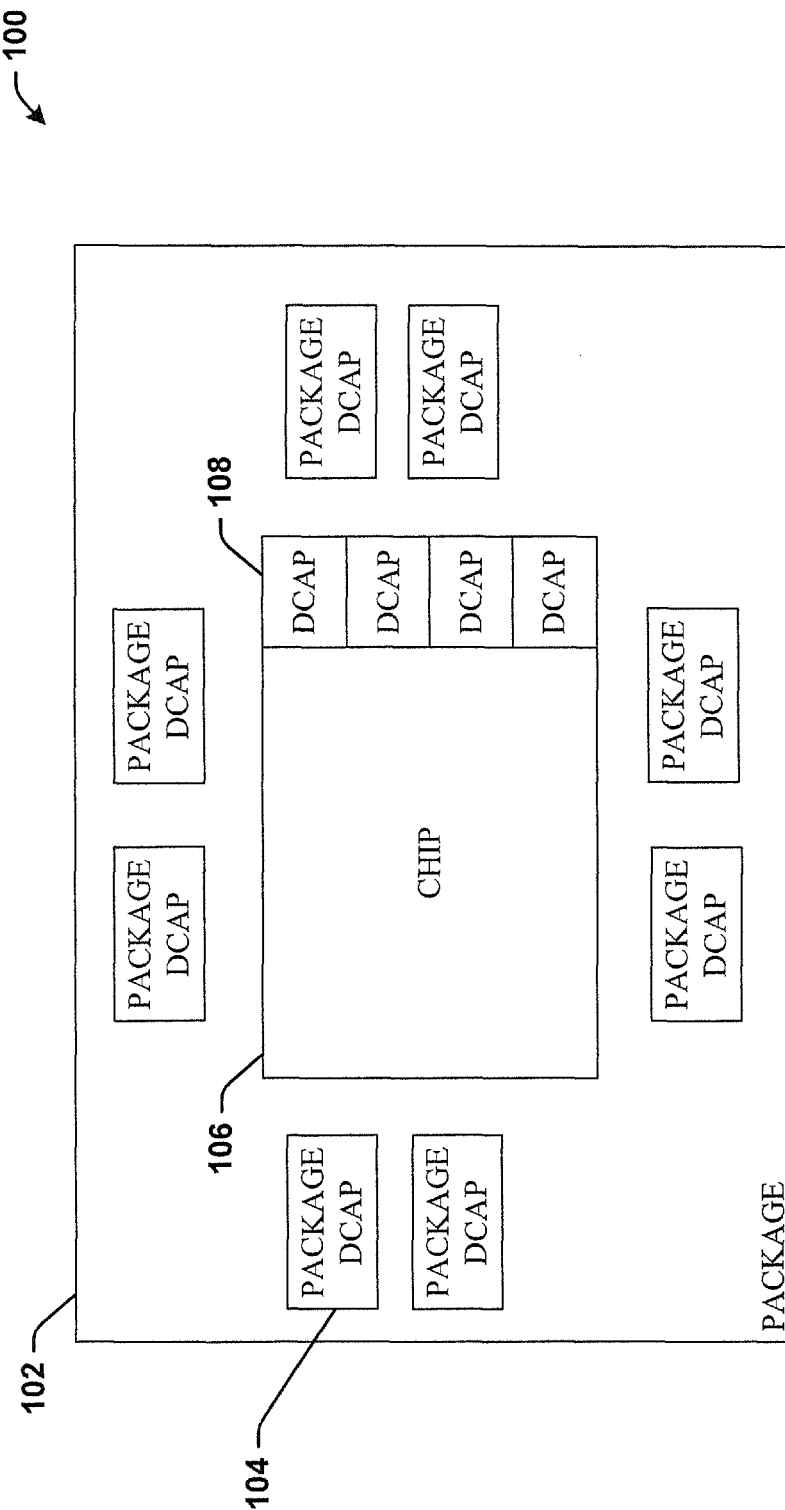
FIG. 1 is a diagram of an example VLSI assembly comprising a chip and a plurality of DCAPs for suppressing voltage supply noise.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

DCAPs are often used in power distribution networks (PDNs) of VLSI systems to suppress voltage supply noise or ripples induced by active circuit elements, thereby shielding other elements of the circuit from power supply voltage fluctuations that may damage the elements or impede their functions. Robust DCAP designs are characterized by high area efficiency, robust electrical properties, and properly targeted operational frequency. In a typical VLSI system, the chip comprising the integrated circuit is connected to the voltage regulator through its power distribution network, and supply noise is suppressed by DCAPs placed throughout the system. FIG. 1 is a diagram of an example VLSI assembly comprising a chip 106 and a number of DCAPs for suppressing voltage supply noise. On-die DCAPs 108—which are integrated components of the chip 106 itself—can be placed near the active circuit elements to suppress high-frequency supply noise. In addition, package DCAPs 104 can be placed on the package 102—the encasement in which the chip is mounted, which also contains the electrical contacts that electrically interface the chip's conductive pads with a circuit board—in order to suppress mid-frequency supply noise. DCAPs can also be placed at the circuit board level (not shown) to suppress low-frequency supply noise.

Figure 2:
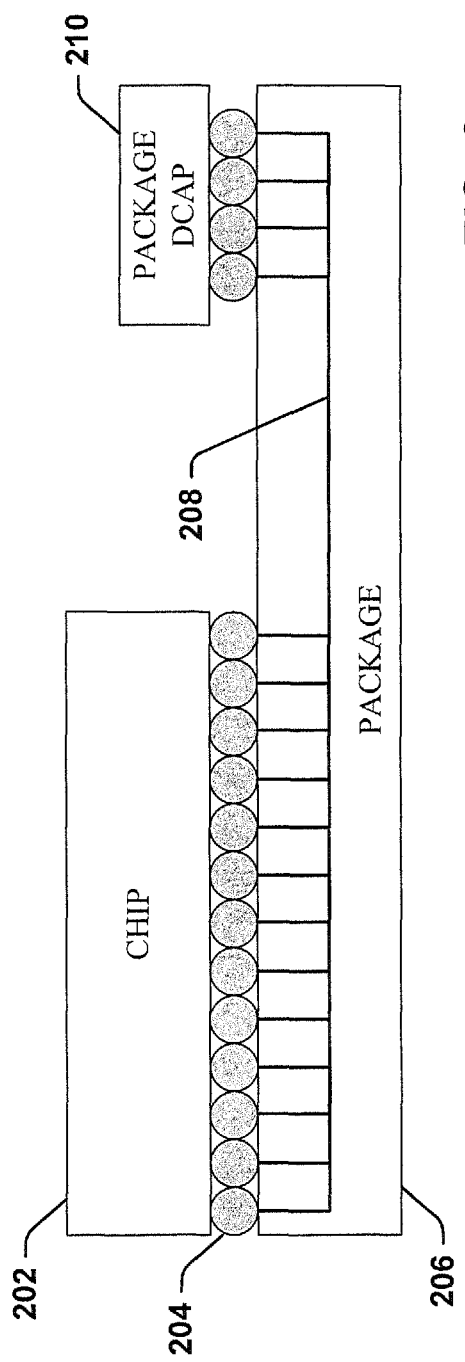
FIG. 2 is a diagram illustrating exemplary connectivity between a chip, a package, and a package DCAP.

FIG. 2 is a diagram illustrating example connectivity between a chip 102, a package 206, and a package DCAP 210. Chip 202 is a semiconductor device containing the electrical components of a VLSI system or other type of integrated circuit. The chip 202 is mounted to package 206, which contains electrically conductive traces 208 and contacts for connecting the terminals of the chip 202 to other electrical components of the package as well as to appropriate traces on a circuit board on which the VLSI assembly is to be mounted. The chip 202 may electrically interface with the traces 208 via electrically conductive power bumps 204. Some of the traces 208 are configured to interface the chip 202 to at least one package DCAP 210 mounted elsewhere on the package 206. As noted above, these package DCAPs can be used suppress mid-frequency supply noise.

This power distribution network design can give rise to power suppression problems in the mid-to-high frequency range. For example, some high-frequency supply noise generated by the active circuit elements of the chip 202 may not be suppressed by the package DCAP 210 due to the large parasitic introduced from the DCAP's placement. On-die DCAPs (such as DCAPs 108 of FIG. 1) can suppress this high-frequency noise to a degree, but have limited effectiveness due to the necessarily small sizes of such on-die DCAPs, which must be sized to fit on the limited chip footprint without interfering with the main VLSI system embodied on the chip. This limitation of package and on-die DCAPs produces an impedance peak at a certain frequency, known as the resonance peak, where supply noise is poorly controlled. Attempts to increase the effectiveness of the on-die DCAP by increasing its size on the chip adversely affect the quality of the VLSI design, since the on-die DCAP is typically located on the chip near the main VLSI system. Consequently, increasing the size of the on-die DCAP can interfere with the VLSI system design.

One possible way to address this issue is to place the on-die DCAP in a low priority location of the chip that allows the DCAP to be increased in size as needed for a given VLSI design. However, this low priority DCAP (LPD) may be poorly integrated with the main system and may negatively impact the overall power distribution network if made arbitrarily large by creating other resonance peaks that may be worse than the original peak being addressed. Therefore, the size of this poorly integrated on-die DCAP must be well controlled in the context of the PDN parasitic. However, the PDN typically cannot be understood in detail until the entire VLSI system design is complete. Until the system design is complete, the uncertainty of the system's PDN prevents accurate estimation of the LPD size required to suppress supply voltage noise without introducing resonant peaks. This hinders the designer's ability to control the size of the LPD commensurate with the requirements of the finished system's PDN, since the on-die LPDs are typically fabricated as part of the same process that forms the rest of the chip.

To allow for a greater degree of design flexibility with regard of the amount of decoupling capacitance that is connected to the system's power domain, one or more embodiments described herein provide for a semiconductor chip having at least one package programmable decoupling capacitor array. The semiconductor chip is configured to allow for a selected amount of on-die decoupling capacitance to be connected to the system PDN after the system design is complete. This is accomplished by forming on-die DCAP arrays on the chip during the silicon design process without initially connecting the DCAPs to the rest of the silicon design. After the VLSI design and testing is complete, a selected amount of on-die decoupling capacitance can be connected to the appropriate power domain of the VLSI through the package design (e.g., based on solder mask changes at the package design phase or by other connectivity means), allowing the designer to select how much capacitance is connected based on the requirements of the finalized design. These arrays of on-die DCAPs are referred to herein as package programmable decoupling capacitor (PPDC) arrays, or programmable connectivity arrays, since the number of DCAPs connected to the system PDN is configurable via the package design. This technique disassociates the uncertainty of system PDN and the size of the low-priority on-die DCAPs, allowing the designer to defer selection of a suitable amount of on-die decoupling capacitance until after the VLSI system design has been finalized, when the PDN can be accurately characterized.

Figure 3:
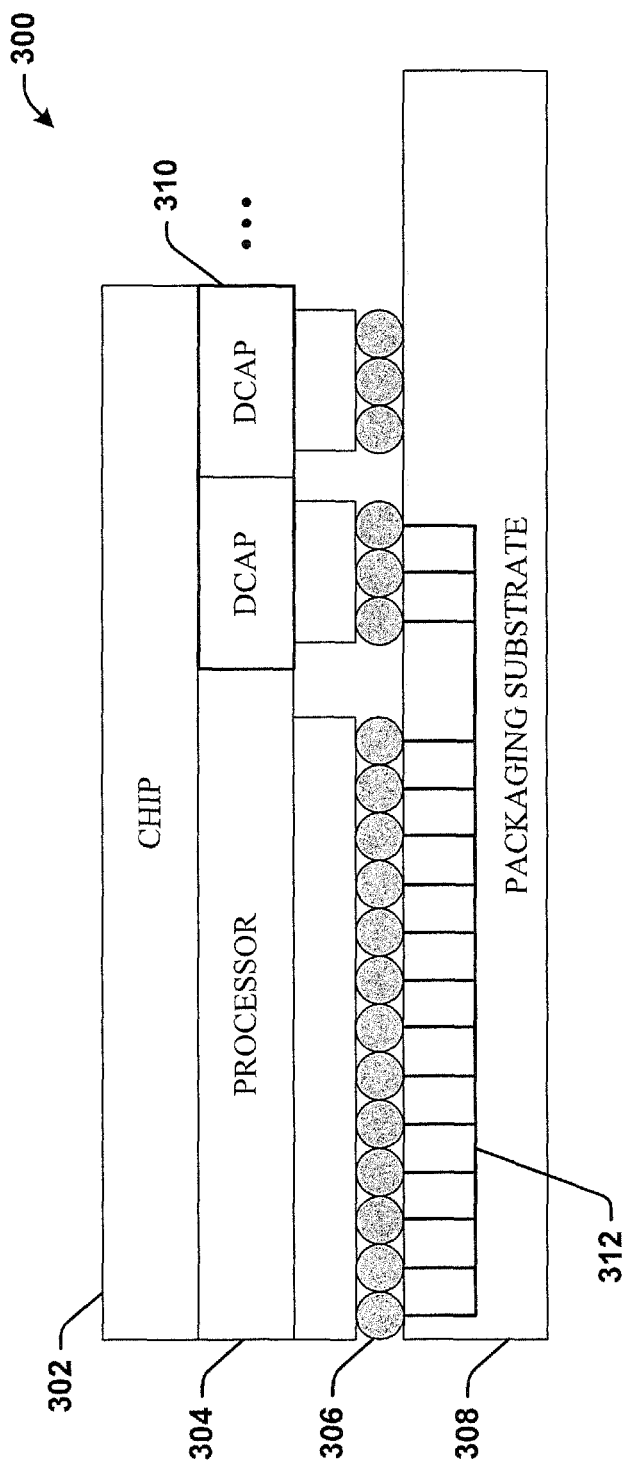
FIG. 3 is a diagram of an example, non-limiting semiconductor assembly showing a single array of package programmable decoupling capacitors connected to the power domain of a VLSI in accordance with the present disclosure.

FIG. 3 is a diagram of an example, non-limiting semiconductor assembly 300 according to one or more embodiments described herein. In this example, semiconductor assembly 300 comprises a semiconductor chip 302 in which is embedded integrated circuit system (e.g., a VLSI system), and a processor 304 for carrying out processing functions in connection with the integrated circuit operations. Semiconductor chip 302 and processor 304 are supported by a packaging substrate 308. Packaging substrate 308 can comprise any material or combination of materials suitable for integrated circuit packaging, including but not limited to ceramic, plastic, metal, lead, etc.

In accordance with one or more embodiments of this disclosure, the chip also includes a programmable connectivity array 310. Programmable connectivity array 310 can comprise one or more arrays of DCAPs positioned on the die. In one or more embodiments, the DCAPs that make up the programmable connectivity array 310 can comprise low-priority DCAP (LPDs) positioned at low priority locations on the die. The DCAPs that make up array 310 are designed during the silicon design process together with the rest of the silicon chip, but initially are not electrically connected to the power domain of the system on chip 302. In one or more embodiments, the DCAPs (e.g., LPDs or other DCAPs) can be formed on the chip near a location where switching activity will take place. Each of the DCAPs that make up the programmable connectivity array 310 comprises a discrete, power domain independent block that can be individually connected to the power distribution network of the VLSI system embedded on the chip 302. Chip 302, processor 304, and programmable connectivity array 310 comprise the silicon portion of semiconductor assembly 300. Although semiconductor assembly 300 is described herein as comprising silicon components, it is to be appreciated that any suitable semiconductor material can be used to form the chip, processor, and DCAPs. Also, the DCAPs that make up the package programmable DCAP arrays are not limited to LPDs, but rather can be formed at any location on the chip without deviating from the scope of this disclosure.

After the system design has been finalized, a selected number of DCAPs of the package programmable array 310 can be electrically connected to the appropriate power domain of the VLSI system via the package design. The number of discrete DCAPs connected to the power distribution network, which determines the amount of on-die decoupling capacitance connected to the system, can be selected based on electrical properties of the finalized system design. For example, the silicon parasitic of the finalized design can determine the frequencies of the resonant peaks that must be suppressed. Accordingly, this silicon parasitic can be taken into consideration when selecting the number of DCAPs to be connected to the power distribution network in order to suppress the resonant peaks. Once the selected number of DCAPs from the array are connected to the power distribution network via the package design, power can be provided to the integrated circuit via the connected DCAPs of the programmable connectivity array, where the connected DCAPs serve to suppress power supply noise. Thus, according to this design, the amount of decoupling capacitance connected to the system can be varied by modifying the connectivity through the package design.

By deferring selection of the amount of decoupling capacitance that is to be connected to the power distribution network until after the VLSI system design has been finalized (specifically, by deferring selection of the decoupling capacitance until the package design phase), the amount of decoupling capacitance can be selected to more accurately correspond to the resonant peaks of the finalized system. The use of package programmable DCAPs allows for selection of the amount of on-die capacitance connected to the system to be based on the actual electrical properties of the finalized VLSI system, rather than on an estimated model of the system PDN. This can eliminate uncertainty involved with modeling the system PDN, since the actual silicon of chip 302 and processor 304 can be tested and experimented upon before the package programming is finalized. When the system design is finalized and a suitable amount of decoupling capacitance has been determined, the selected number of DCAPs can be electrically connected to the power domain via electrically conductive traces 312 within the packaging substrate 308. For example, the packaging substrate 308 can be fabricated such that electrical traces 312 are formed between the selected number of DCAPs and the appropriate nodes of the power distribution network; e.g., by configuring or altering the solder mask of the package design, or through other means of configuring the electrical connectivity through the package design.

Figure 4:
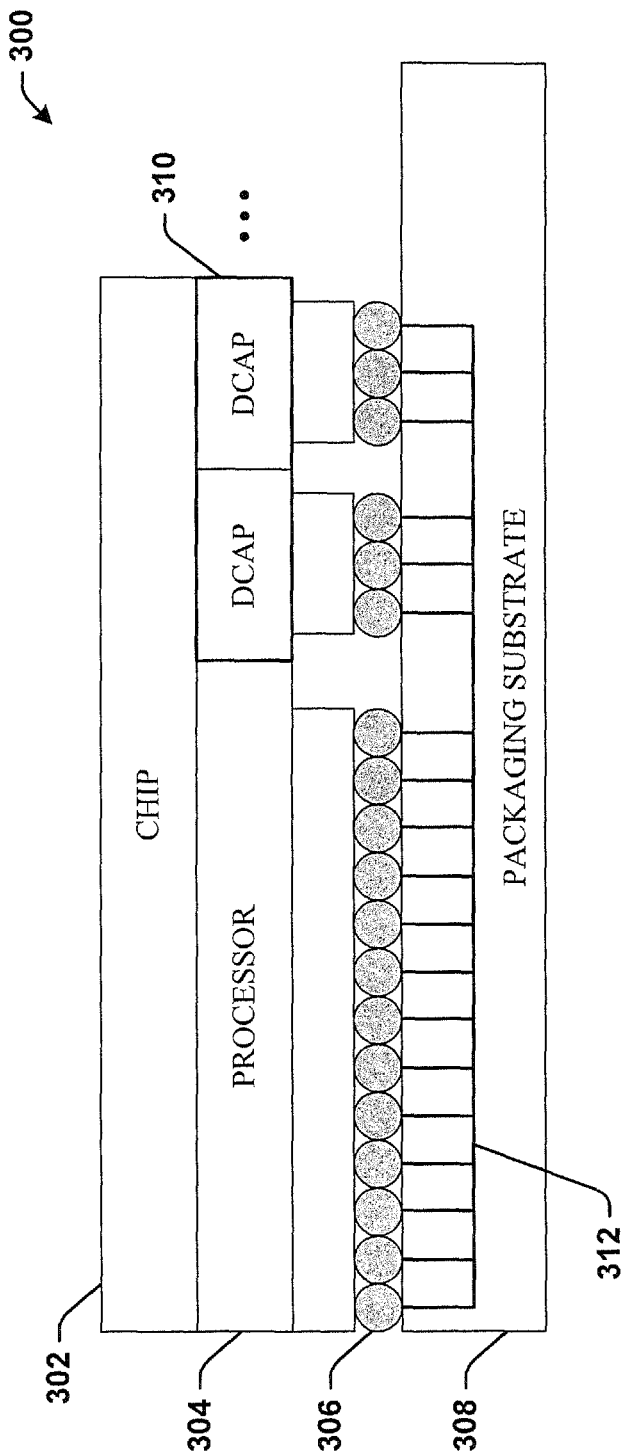
FIG. 4 is a diagram of an example, non-limiting semiconductor assembly showing all package programmable decoupling capacitor arrays connected to the power domain of a VLSI in accordance with the present disclosure.

In an example scenario, traces 312 of package 312 are arranged to connect to electrically conductive connection bumps 306 deposited on the die. Bumps 306 are disposed on the discrete blocks of DCAPs comprising the programmable connectivity array, and are configured to connect the discrete blocks to the power distribution network of the VLSI system embedded on chip 302. FIG. 3 illustrates a scenario in which only one array of DCAPs is connected through packaging substrate 308, while FIG. 4 illustrates a scenario in which two arrays are connected through packaging substrate 308. In general, the number of DCAPs connected to the power domain via the packaging substrate—and the corresponding amount of decoupling capacitance—can be targeted to match the resonant frequency of the finalized system.

Once connected to the power domain, the connected DCAPs collectively serve as a band-rejection filter or a notch filter (depending on the resistance native to the DCAPs) capable of filtering the resonant peaks of the system. The frequency of the suppression provided by the DCAPs (that is, the frequency of the band-rejection filter formed by the connected DCAP blocks) can be further controlled by the number of bumps 306 that are used to connect each of the discrete DCAP blocks to the active power domain of the finalized system. For example, each DCAP block of the programmable connectivity array can be connected to multiple connectivity bumps 306. For each DCAP block to be connected to the power distribution network, a selected number of bumps associated with that block can be connected to the power distribution network, where the number of bumps connected to the power distribution network can determine a frequency of the power supply noise suppression.

The array(s) of DCAPs are referred to as package programmable decoupling capacitors (PPDC), or programmable connectivity arrays, since the number of decoupling capacitors connected to the power domain is programmable through appropriate parameters of the package design (e.g., the formation of traces 312). For example, the programmable connectivity can be implemented by making suitable changes to the solder mask of the package design. The DCAPs that make up array 310 comprise discrete blocks of the silicon wafer that are independent of the power domain, and so each DCAP can be individually connected to the power distribution network of the system implemented on the chip.

If desired, DCAP blocks that are not connected to a particular system power domain can be connected to power domains of other systems in order to suppress the supply noise and to improve the power integrity of the other supplies. For example, two or more different VLSI systems may reside on a single chip, with one or more shared arrays of DCAPs also residing on the chip. During the design phase, it may be decided that the first VLSI system requires a first number of decoupling capacitors from the array in order to effectively suppress power supply noise across all frequencies (e.g., to suppress noise at all resonant peaks), while the second VLSI system requires a second number of decoupling capacitors. Accordingly, packaging substrate 308 can be designed to electrically connect the necessary number of DCAPs from the arrays to the respective VLSI systems. As an initial design choice, the number of discrete DCAP blocks comprising the array(s) can be sized to exceed an estimated amount of capacitance required for both VLSI systems, such that the array is ensured to supply the necessary amount of capacitance for both systems despite initial uncertainty regarding the amount of on-die decoupling capacitance required for both systems. After the VLSI designs are finalized, the number of DCAPs required for both systems can be connected via the package, where the number of DCAPs ultimately connected to the VLSI systems may be less than the total number of DCAPs available in the array(s).

The design described herein allows an array of on-die DCAPs to be placed on the die (e.g., at a low priority location in the case of LDPs) and selectively added to the overall VLSI design. Thus, the amount of on-die decoupling capacitance can be increased if needed without intruding on the VLSI circuit design on the chip. Moreover, these techniques allow final selection of the number of decoupling capacitors to be deferred until the system design has been finalized, when the electrical properties of the VLSI system (e.g., the resonant peaks, parasitic, etc.) can be more accurately characterized and understood relative to modeled estimates. This allows the designer to select a suitable amount of on-die decoupling capacitance based on the actual measured properties of the system rather than a modeled estimate of the system's power distribution network. In some systems, the array of PPDCs can be used in conjunction with other decoupling capacitors—e.g., package DCAPS and/or board DCAPS—in order to suppress power supply noise across all frequencies.

Figure 5:
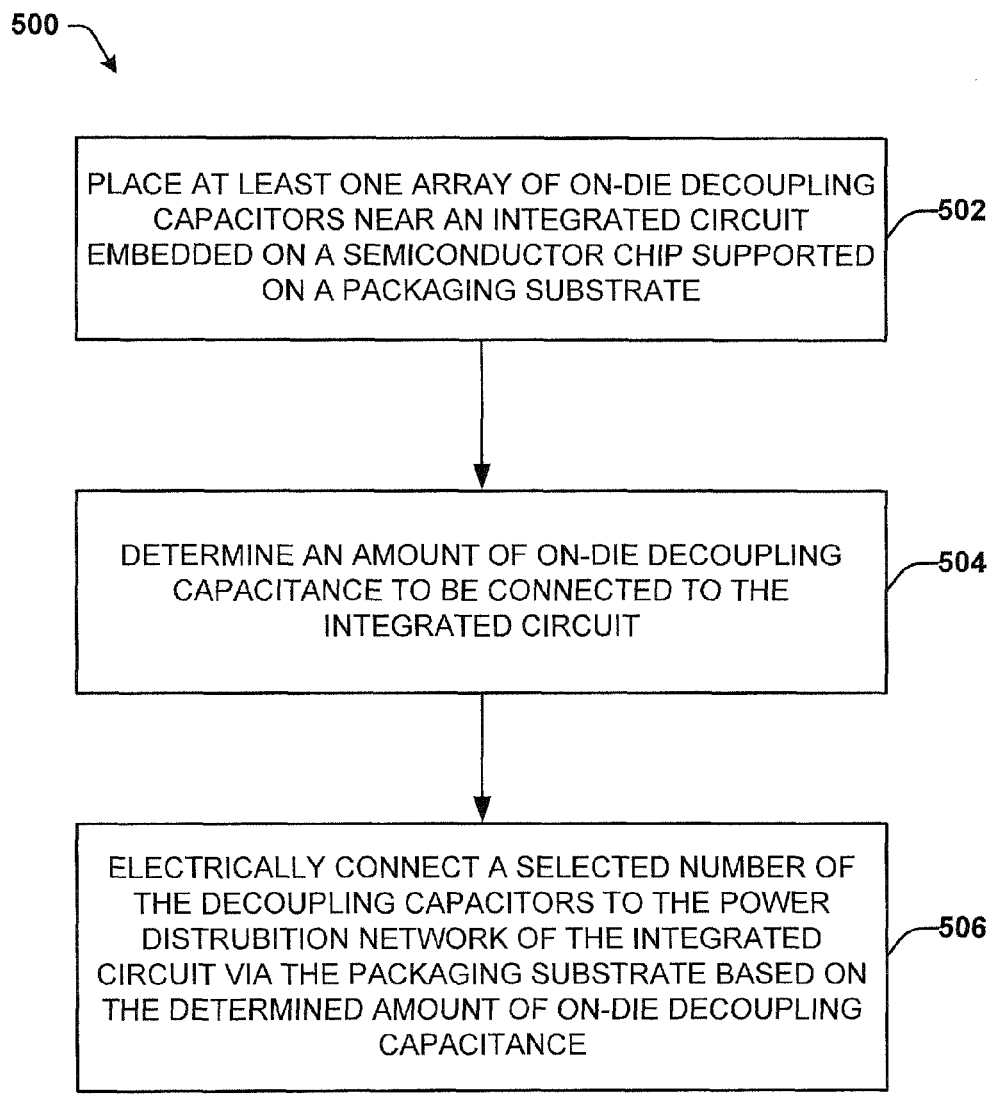
FIG. 5 is a flow diagram of an example, non-limiting embodiment for connecting a selected amount of on-die decoupling capacitance to an integrated circuit system in accordance with the present disclosure.
Figure 6:
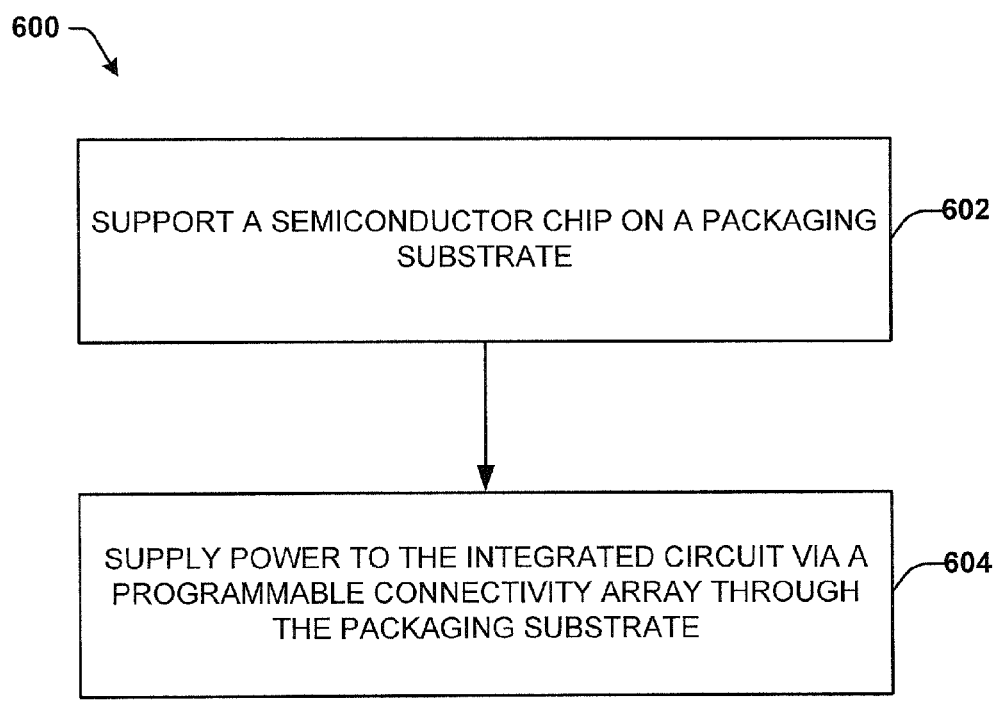
FIG. 6 is a flow diagram of an example, non-limiting embodiment for suppressing resonant peaks in an integrated circuit in accordance with the present disclosure.

FIGS. 5-6 illustrate methodologies in accordance with one or more embodiments of the subject application. While, for purposes of simplicity of explanation, the methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 5, a flow diagram of an example, non-limiting embodiment for connecting a selected amount of on-die decoupling capacitance to an integrated circuit system is shown. Method 500 can begin at block 502, where at least one array of on-die decoupling capacitors are placed near an integrated circuit on a semiconductor chip supported on a packaging substrate. The decoupling capacitors can comprise discrete blocks on the semiconductor chip that can be individually connected to the power domain of the integrated circuit (e.g., a VLSI system) via the packaging substrate.

At 504, an amount of on-die decoupling capacitance to be connected to the integrated circuit is determined. In some embodiments, the amount of on-die decoupling capacitance can be determined based on results of electrical analysis performed on a VLSI system implemented by the integrated circuit. In other embodiments, electrical analysis equipment can perform testing on the VLSI system to determine an amount of on-die decoupling capacitance that will effectively suppress power supply noise of the system. For example, this analysis may identify the frequency locations of one or more resonant peaks of the VLSI system and determine a suitable amount of on-die decoupling capacitance based on the locations of these resonant peaks.

At 506, a selected number of decoupling capacitors are electrically connected to the power distribution network of the integrated circuit via the packaging substrate. The selected number of decoupling capacitors can be based, for example, on the amount of on-die decoupling capacitance determined at step 504. For example, selected decoupling capacitors can be electrically connected to the power domain of the integrated circuit by electrical trace connections formed in the packaging substrate, allowing the decoupling capacitors to be selectively connected to the power domain via the package design.

Referring to FIG. 6, a flow diagram of an example, non-limiting embodiment for suppressing resonant peaks in an integrated circuit is shown. Method 600 can begin at block 602, where a semiconductor chip is supported on a packaging substrate. The integrated circuit can comprise, for example a VLSI system vulnerable to voltage supply noise or ripples induced by active circuit elements. At 604, power is supplied to the integrated circuit via a programmable connectivity array through the packaging substrate. The programmable connectivity array can comprise, for example, one or more discrete blocks of decoupling capacitors that can be electrically connected to the power distribution network of the integrated circuit via the packaging substrate. The programmable connectivity can be based, for example, on solder mask changes at the package design, or can otherwise be varied based on modifications to the package design. In one or more embodiments, the decoupling capacitors can comprise low-priority decoupling capacitors placed at a low priority location of the chip.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A semiconductor chip, comprising:
an integrated circuit disposed on a packaging substrate; and
a power distribution network that is electrically connectable to the integrated circuit via a programmable connectivity array via the packaging substrate,
wherein
the programmable connectivity array comprises discrete blocks of on-die programmable decoupling capacitors formed on the semiconductor chip,
multiple electrically conductive bumps are disposed on each block of the discrete blocks and are connectable to the power distribution network,
a specified capacitance is obtainable by connecting a first subset of the discrete blocks of the on-die programmable decoupling capacitors to the power distribution network and the integrated circuit via the packaging substrate while a second subset of the discrete blocks of the on-die programmable decoupling capacitors remains unconnected, and
the first subset of the discrete blocks of the on-die programmable decoupling capacitors is configured to serve as a band rejection filter, and a frequency of the band rejection filter is controllable as a function of a first number of the first subset of the discrete blocks and a second number of the electrically conductive bumps used to connect each block of the first subset of the discrete blocks to the power distribution network.

2. The semiconductor chip of claim 1, wherein the discrete blocks of on-die programmable decoupling capacitors and the power distribution network are integrated in the semiconductor chip.

3. The semiconductor chip of claim 1, wherein the first subset of the discrete blocks of the on-die programmable decoupling capacitors is configured to serve as a notch filter.

4. The semiconductor chip of claim 1, wherein the specified capacitance is configured to suppress a resonant frequency of the semiconductor chip.

5. The semiconductor chip of claim 1, wherein the programmable connectivity array is variable by modifying the programmable connectivity array of the packaging substrate.

6. The semiconductor chip of claim 1, wherein the second subset of the discrete blocks of the on-die programmable decoupling capacitors are connectable to an alternative power distribution system of the chip.

7. The semiconductor chip of claim 1, wherein the discrete blocks of on-die programmable decoupling capacitors comprise low priority decoupling capacitors.

8. The semiconductor chip of claim 1, further comprising a processor configured to perform one or more processing functions in connection with operation of the integrated circuit.

9. A method of suppressing supply noise in a semiconductor chip, comprising:
  placing a programmable connectivity array physically near an integrated circuit embedded in a semiconductor chip, wherein the programmable connectivity array comprises discrete blocks of on-die programmable decoupling capacitors formed on the semiconductor chip, the semiconductor chip is supported on a packaging substrate, and multiple electrically conductive bumps are disposed on each block of the discrete blocks;
  connecting a first subset of the discrete blocks of the on-die programmable decoupling capacitors to the integrated circuit and a power distribution network of the semiconductor chip to obtain a target capacitance, wherein the connecting causes a second subset of the discrete blocks of the on-die programmable decoupling capacitors to remain unconnected, the first subset of the discrete blocks is configured to serve as a band rejection filter, and the connecting comprises
    setting a frequency of the band rejection filter as a function of a first number of the first subset of the discrete blocks and a second number of the electrically conductive bumps used to connect each block of the first subset of the discrete blocks to the power distribution network; and
  supplying power to the integrated circuit via the first subset of the discrete blocks through the packaging substrate.

10. The method of claim 9, wherein the connecting comprises connecting the first number of the first subset of the discrete blocks to yield the target capacitance.

11. The method of claim 9, further comprising configuring the discrete blocks of on-die programmable decoupling capacitors to serve as a notch filter in the integrated circuit.

12. The method of claim 9, wherein the discrete blocks of on-die programmable decoupling capacitors are integrated in the semiconductor chip.

13. A method of suppressing resonant peaks in an integrated circuit in a semiconductor chip, comprising:
  supporting the semiconductor chip on a packaging substrate; and
  supplying power to the integrated circuit via a programmable connectivity array through the packaging substrate,
  wherein
    the programmable connectivity array comprises a first subset of discrete blocks of on-die programmable decoupling capacitors that are formed on the semiconductor chip, the first subset being a selectable number of the discrete blocks, smaller than a total number of the discrete blocks, that correspond to a defined capacitance,
    a second subset of the discrete blocks of on-die programmable decoupling capacitors remain unconnected,
    the discrete blocks are placed physically near the integrated circuit,
    the first subset of the discrete blocks form a band rejection filter of the semiconductor chip,
    multiple electrically conductive bumps are formed on each block of the discrete blocks of on-die programmable decoupling capacitors, and
    a frequency of the band rejection filter is configurable as a function of the number of the first subset of the discrete blocks and a number of the electrically conductive bumps through which the power is supplied to the integrated circuit.

14. The method of claim 13, further comprising configuring the first subset of discrete blocks to serve as a notch filter for the integrated circuit.

15. The method of claim 9, further comprising connecting one or more blocks of the second subset of the discrete blocks of the on-die programmable decoupling capacitors to a second power distribution network of the semiconductor chip.

16. The method of claim 9, wherein the connecting comprises forming electrical traces in the packaging substrate that electrically connect the first subset of the discrete blocks of the on-die programmable decoupling capacitors to the integrated circuit and the power distribution network.

17. The semiconductor chip of claim 1, wherein the first subset of the discrete blocks are connected to the power distribution network and the integrated circuit via conductive traces within the packaging substrate.

18. The method of claim 13, wherein the supplying power comprises supplying the power from a first power distribution network of the semiconductor chip, and the method further comprises supplying power from a second power distribution network of the semiconductor chip to another integrated circuit in the semiconductor chip via the second subset of the discrete blocks.

19. The method of claim 13, further comprising operating a processor to perform a processing function in connection with operation of the integrated circuit.

20. The method of claim 13, further comprising determining the defined capacitance as a capacitance determined to suppress a resonant frequency of the semiconductor chip.

* * * * *